(12) United States Patent
Körber et al.

(10) Patent No.: US 7,466,559 B2
(45) Date of Patent: Dec. 16, 2008

(54) COMPONENT SUPPORT

(75) Inventors: Werner Körber, Betzenstein (DE); Eike Waltz, Aptos, CA (US)

(73) Assignee: RITTAL RES Electronic Systems GmbH & Co. KG, Herborn (DE)

( * ) Notice: Subject to any disclaimer, the term of this patent is extended or adjusted under 35 U.S.C. 154(b) by 0 days.

(21) Appl. No.: 11/447,685

(22) Filed: Jun. 6, 2006

(65) Prior Publication Data

US 2007/0076385 A1    Apr. 5, 2007

(30) Foreign Application Priority Data

Jun. 6, 2005    (DE) ................... 10 2005 026 181

(51) Int. Cl.
*H05K 5/00*    (2006.01)
(52) U.S. Cl. .................. 361/756; 361/727; 361/679
(58) Field of Classification Search ........... 361/756, 361/727, 802, 741, 679, 686, 748–749; 439/377, 439/55, 70–71, 65, 67
See application file for complete search history.

(56) References Cited

U.S. PATENT DOCUMENTS

| | | | | |
|---|---|---|---|---|
| 4,597,291 A | * | 7/1986 | Motomiya | .............. 73/431 |
| 4,821,145 A | * | 4/1989 | Corfits et al. | ............... 361/692 |
| 5,818,696 A | * | 10/1998 | Knoop | ....................... 361/730 |
| 6,421,252 B1 | * | 7/2002 | White et al. | ................ 361/797 |
| 6,636,428 B2 | * | 10/2003 | Follmer et al. | .............. 361/797 |
| 6,646,890 B1 | | 11/2003 | Byers et al. | |
| 6,935,868 B1 | * | 8/2005 | Campini et al. | ............... 439/67 |
| 7,172,432 B2 | * | 2/2007 | Campini et al. | ............... 439/74 |
| 2006/0140179 A1 | * | 6/2006 | Campini et al. | ............. 370/360 |
| 2006/0218329 A1 | * | 9/2006 | DeNies et al. | .............. 710/301 |

* cited by examiner

*Primary Examiner*—Hung S Bui
(74) *Attorney, Agent, or Firm*—Pauley Petersen & Erickson

(57) ABSTRACT

A component support having two or more module carriers aligned with each other in a direction across a width of a component support. The module carriers have two insert card guidance devices connected with each other via a support element so that guides of the insert card guidance devices, which extend in the direction of the depth of the component support, form receivers for one or several insert cards. The insert cards are electrically connected to a rear support by plug-in connections, and the module carriers are releasably connected with the support so that the removal of a single arbitrary module carrier from the row of the module carriers is possible. The component can be individually matched in a simple manner to different applications.

11 Claims, 4 Drawing Sheets

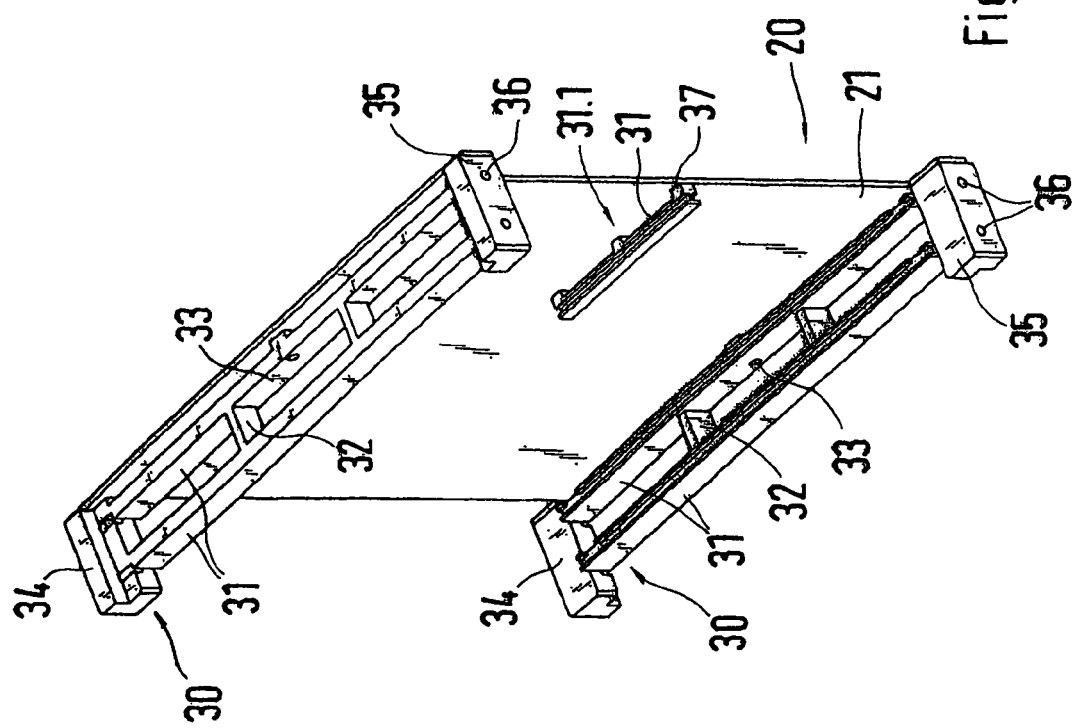
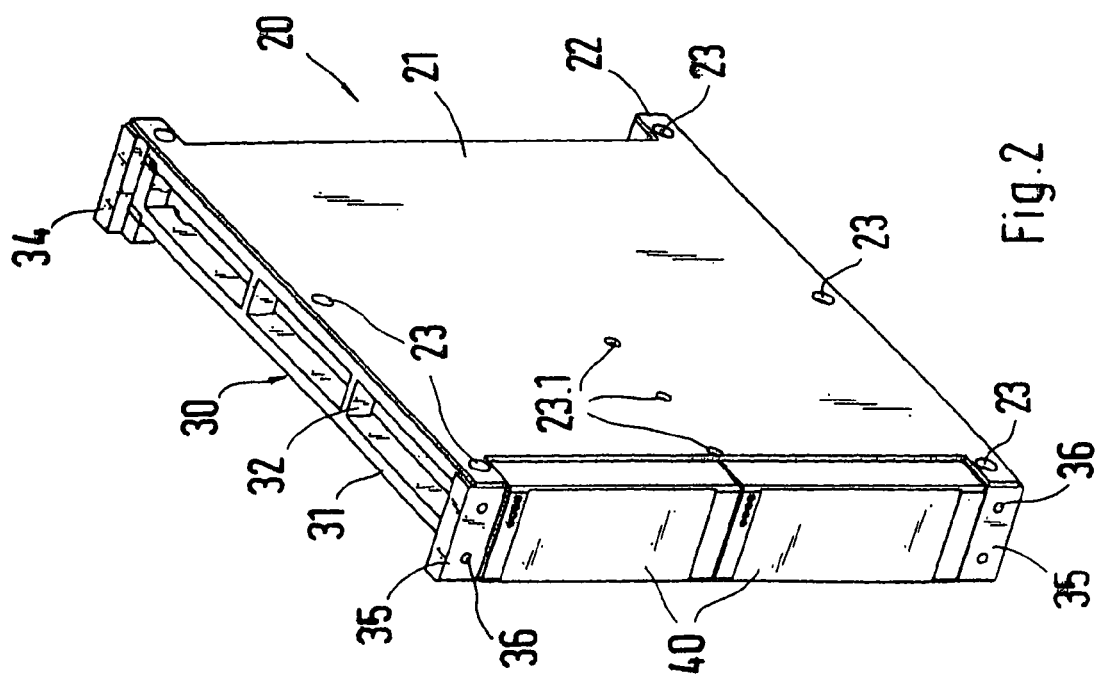

COMPONENT SUPPORT

BACKGROUND OF THE INVENTION

1. Field of the Invention

This invention relates to a component support, having two or more module carriers aligned with each other in a direction across a width of a component support, wherein the module carriers have two insert card guidance devices connected with each other via a support element so that guides of the insert card guidance devices, which extend in the direction of the depth of the component support, form receivers for one or several insert cards. The insert cards are electrically connected to a rear support by plug-in connections, and the module carriers are releasably connected with the support so that the removal of a single arbitrary module carrier from the row of the module carriers is possible.

2. Discussion of Related Art

A component support is taught by U.S. Pat. No. 6,646,890. A housing, into which several insert card guidance devices have been installed, is used. It is possible to introduce insert cards, which lie parallel and next to each other, into the insert card guidance devices. The insert cards have a strip of plugs on their back end. With these, the introduced insert card contacts a plug-in receiver, which is attached to a printed circuit board, for example a back plane, maintained on a rear of the housing. The insert cards have plug-in points to make them individually different or for supplementing their functions, into which additional printed circuit boards can be inserted. For example, the additional printed circuit boards are known as slave boards or mezzanine boards. From the open front of the housing they can be introduced into guidance devices and pushed into the plug-in locations.

Modern applications for component supports require the component supports to be differently equipped. The component housing must be selected to correspond to the intended application and then equipped with the desired number of insert cards. Because the dimensions of the component housings are pre-fixed, it is possible for some insert card receivers to remain empty, so that valuable structural space remains unused.

SUMMARY OF THE INVENTION

It is one object of this invention to provide a component support which has a simple structure and can be easily matched to modular applications.

This object is achieved with a modular support having two or more module carriers aligned with each other in the direction across the width of the component support, wherein the module carriers have two insert card guidance devices connected with each other via a support element so that guides of the insert card guidance devices, which extend in the direction of the depth of the component support, form receivers for one or several insert cards. The insert cards are electrically connected to a rear support by plug-in connections, and the module carriers are releasably connected with the support so that the removal of a single arbitrary module carrier from the row of the module carriers is possible.

In accordance with this invention, the component support is assembled from two or more module carriers, each of which has receptacles for modules. The number of module carriers can be selected as a function of the required number of insert cards. It is thus possible to design the dimensions of the component support in accordance with the required applications. The module carriers are arranged together on a rear support, wherein the support simultaneously forms the mechanical and the electrical interface. In order to simply match the component support to the application, it is possible to remove any arbitrary module carrier independently of the remaining module carriers. Thus, according to this invention, a kit makes possible the individual design of component supports.

In accordance with one embodiment of this invention, the module carriers are connected with the support by a connecting mechanism which can be actuated at the rear of the support.

A simple installation and dismantling of the module carriers is possible because the connecting mechanism can be operated from the rear.

In order to achieve compatibility between different module carriers, on the side where they are aligned, the module carriers have mechanical interfaces which are matched to each other.

In this case, additional stabilization is achieved because the mechanical interfaces contain anchoring elements, which connect the adjoining module carriers with each other near the interface.

With this embodiment, the anchoring elements form a linear guidance device which makes possible a shifting of the module carriers with respect to each other in the direction of the plane formed by the depth and height directions of the component support, preferably in the direction of the depth of the component support. In that case, the direction of the shift of the module carrier corresponds to the movement of the plug-in connection or plug-in disconnection.

In one embodiment of this invention, the support at the rear has rows of fastening receivers which are matched to each other in a grid-like manner, and the graduation of the grid pattern measurement is matched to the graduation of the fastening receivers, the threaded receivers, of the lined-up module carriers.

A possible component support in accordance with this invention can be designed so that the module carriers have threaded receivers on their front ends facing away from the rear support. Transverse connecting elements extending in the wide direction of the component support are attached to at least two module carriers of the row of module carriers. The transverse connecting elements can further increase the functionality of the component support. It is possible for the transverse connecting elements to form additional connecting points, for example, or form air guidance devices.

If the support is designed as a wall, the supports additionally form a rear access protection, or the support can already be a part of a housing of, for example a switchgear cabinet, in which the component support is installed.

BRIEF DESCRIPTION OF THE DRAWINGS

This invention is explained in greater detail in view of an exemplary embodiment of a component support represented in the drawings, wherein:

FIG. 2 shows a module carrier in a perspective view, from the right;

FIG. 3 shows the module carrier of FIG. 2, in a perspective view from the left;

DESCRIPTION OF PREFERRED EMBODIMENTS

Figure 1:
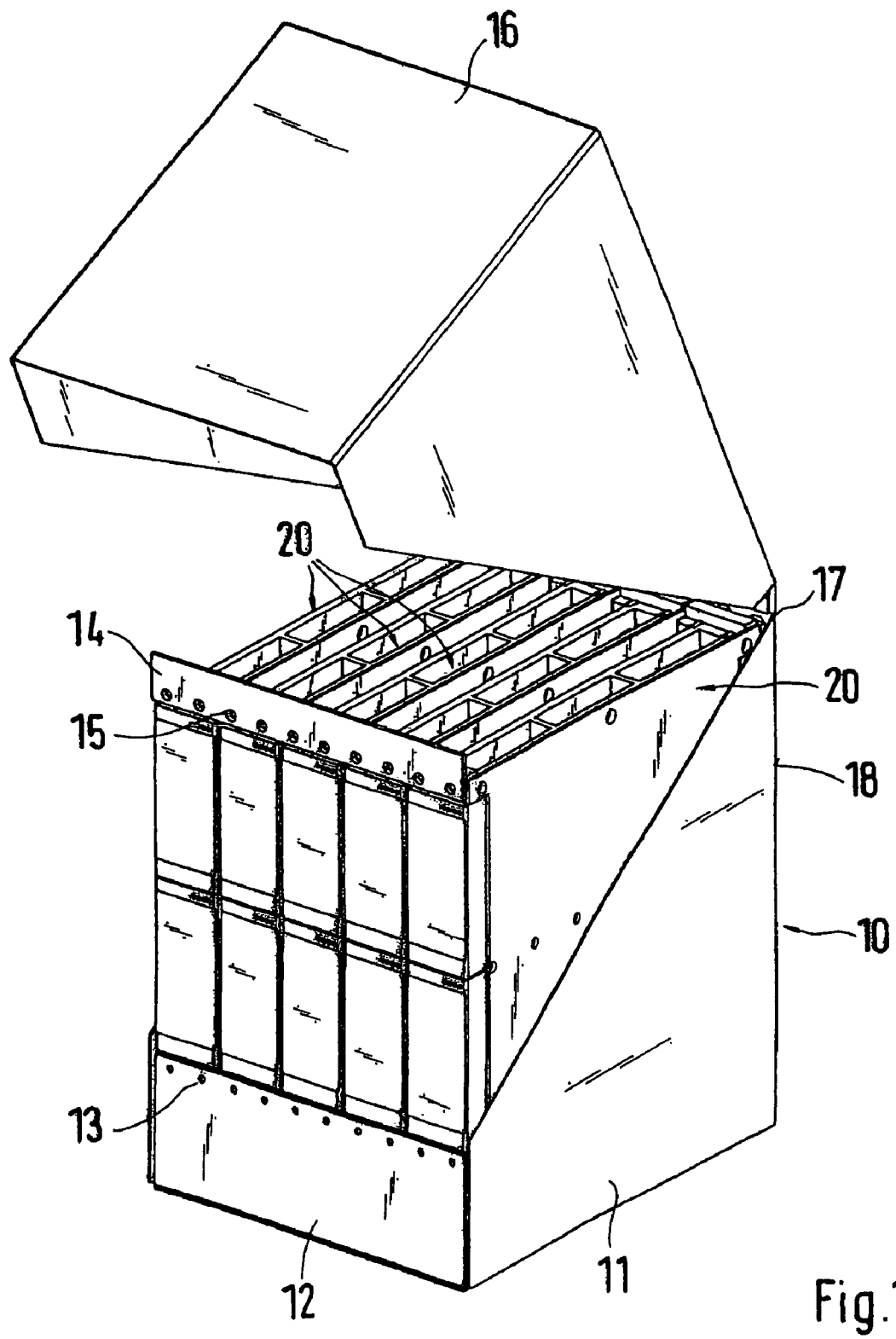
FIG. 1 shows a perspective view of a component support installed in a receiver housing.
Figure 4:
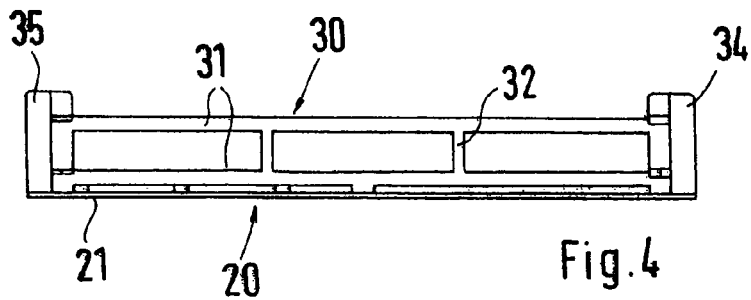
FIGS. 4 to 6 each shows the module carrier in accordance with FIGS. 2 and 3, in three views, a top view, a front view and a side view, respectively.
Figure 5:
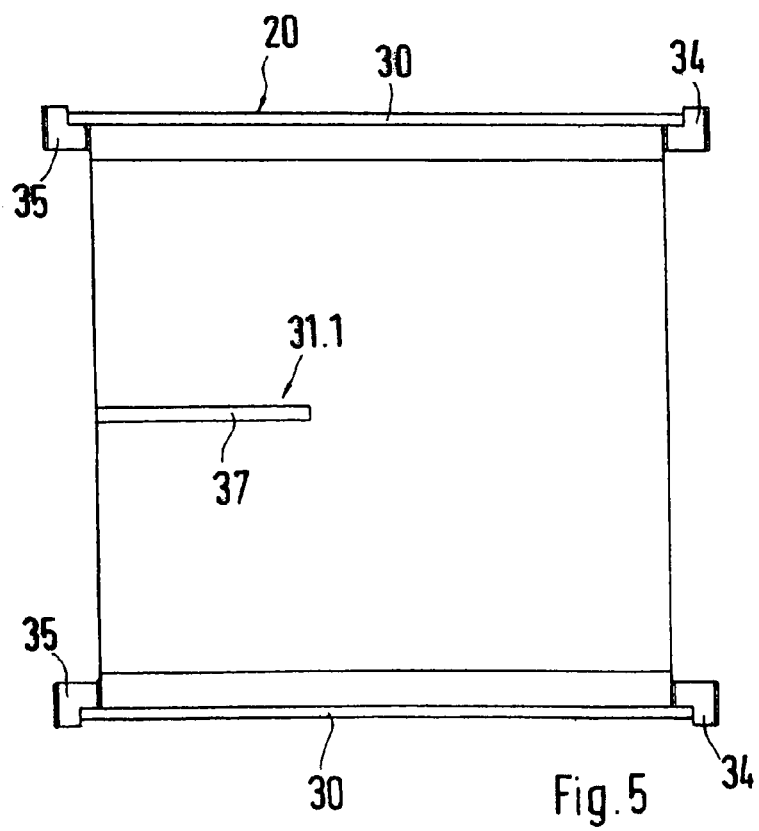

A receiver housing 10, into which a component support is introduced, is shown in FIG. 1. The receiver housing 10 has a support 18 designed as a wall, at the rear. Two lateral walls 11 adjoin the support 18 and are connected with each other via a front wall 12 extending parallel relative to the support 18. A cover 16 is fastened on the support 18 by a hinge 17 with a horizontal pivot axis.

The component support, which includes a plurality of module carriers 20, is introduced into the receiver housing 10. The shape of the module carrier 20 is shown in the representations in accordance with FIGS. 2 to 6. As shown, the module carrier 20 has two insert card guidance devices 30. Each of the insert card guidance devices 30 forms two guides 31. The guides 31 are connected in one piece by strips 32 which extend transversely with respect to the longitudinal direction of the guides 31. Openings are between the guides 31 and the strips 32. Cooling air can circulate through the openings. On their ends at the longitudinal sides, the guides 31 each is connected with each other in one piece by a fastening element 34, 35. The fastening elements 34, 35 have threaded receivers 36 directed toward the front or the rear.

The insert card guidance devices 30 are connected with each other by a support element 21. In this case, the guides 31 are arranged opposite each other and thus form receptacles for insert cards. The insert cards can be displaced in the guides 31 with their horizontal edges in the direction of the depth of the component support. The support element 21 is designed as a wall. As FIG. 2 shows, the support element 21 has screw receivers 23 into which fastening screws can be inserted and screwed into threaded receivers of the insert card guidance devices 30.

Figure 6:
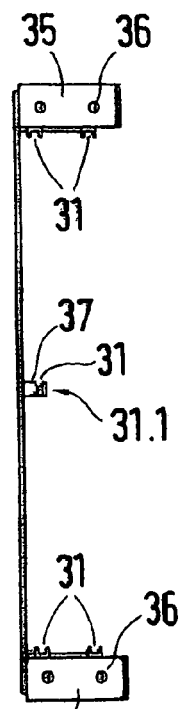

As FIG. 3 shows, centered between the two insert card guidance devices 30, the support element 21 has a further guide rail 31.1 with two guides 31. FIG. 6 shows the guides 31 located opposite the guides 31 of the fastening elements 34, 35 adjoining the support element 21. Spacers are formed on the guide rail 31.1 in order to maintain the guide rail 31.1 exactly in this position. Ventilation openings for guiding the cooling air are between the guide rail 31.1, the support element 21 and the spacers 37. With their guides 31 and the oppositely located guides 31 of the fastening elements 34, 35, the guide rails 31.1 form receptacles, into which insert cards of half the structural height can be introduced.

The guide rail 31.1 has threaded receivers in its spacers and are aligned with threaded receivers 23.1 of the support element 21, so that simple fastening and exact alignment on the support element 21 is possible.

FIG. 2 shows the support element 21 in detail. The support element 21 has four necks 22, which protrude toward the front and the rear. Together with the fastening elements 34, 35, receptacles thus result, into which front plates 40 of the insert cards, not represented, can be set flush. The module carriers 20 in FIGS. 2 to 6 have two guides 31 each at the fastening elements 34, 35. However, it is also possible to provide only one, or several guides 31.

Module carriers 20 with one guide 31 or, as shown in FIGS. 2 to 6, two guides 31 can be advantageous for forming a component support. In this case, it is possible to simultaneously install module carriers 20 with different numbers of guides on a component support. In connection with module carriers 20 with two guides 31 and correspondingly with two receptacles for insert cards, it is possible to install insert cards of different formats.

Figure 7:
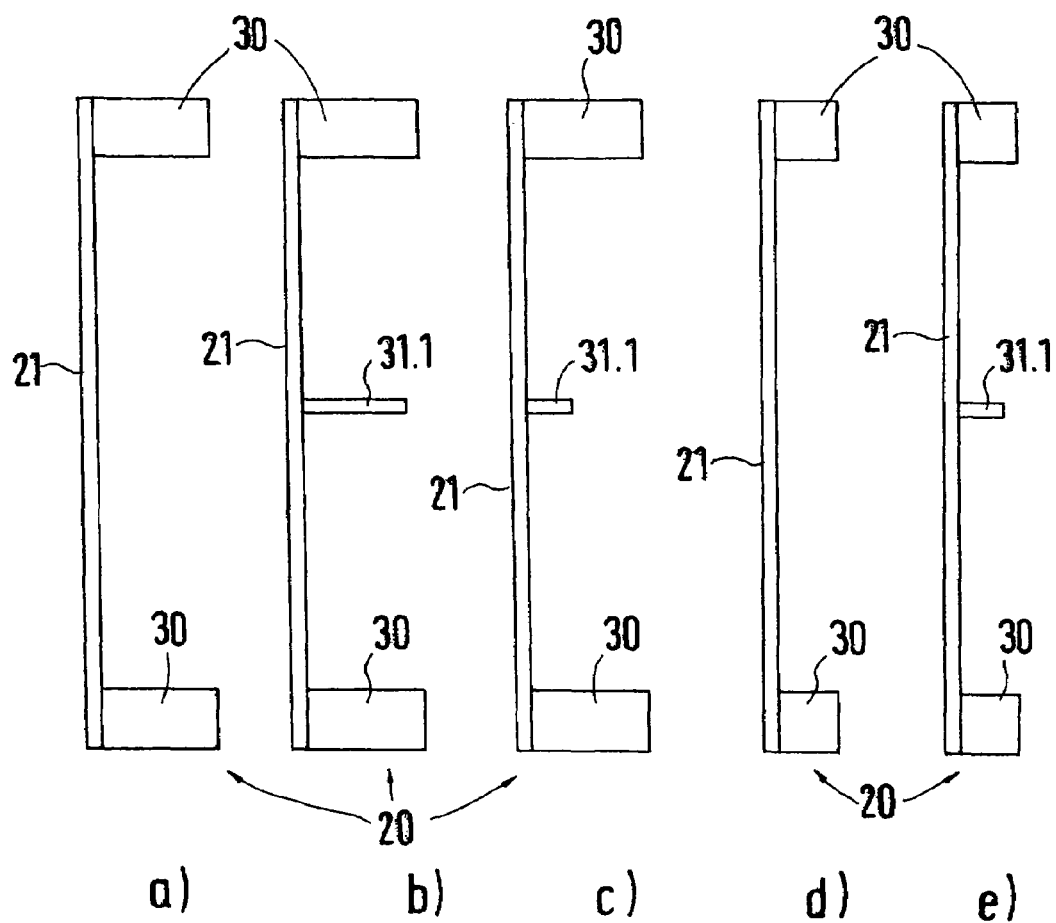
FIG. 7 shows six different designs of module carriers, in schematic views.

Examples of module carriers 20 for different insert card formats are shown in FIG. 7. The variation a) shows a module carrier 20 which can receive two insert cards extending over the full installation height. However, it is also possible to install only one insert card which extends over the full height and the entire available width on the installation space of the module carrier 20. Thus they are called insert cards of single height and double width. The variation b) shows a guide rail 31.1 installed, which extends over twice the width and therefore has four guides 31. Accordingly, it is possible to install four insert cards of half the height and a single width, or two insert cards of half the height and a double width in the module carrier 20.

The module carrier 20 in accordance with variation c) corresponds to the design in accordance with FIGS. 2 to 6. It is possible to insert two insert cards of half the height and one of full height, but each of half the width, in the module carrier 20. Alternatively, two insert cards of double width and half the height can also be used.

In the variations d) and e), receptacles are formed on the module carrier 20, which extend over the full height, but only over a single width. With the variation d) a high insert card, and with the variation e) two half-high insert cards can be installed.

As FIGS. 2 and 3 show, the module carriers 20 have flat surfaces on the support element 21 on the side facing away from the insert card guidance devices 30 that correspond with flat surfaces of the fastening elements 34, 35.

Thus, the flat surfaces form mechanical interfaces, by which the module carriers 20 can be placed side-by-side. The module carriers 20 can be installed on the rear of a support 18. The support 18 can be a back plane, a mid plane, a profiled element or, for example in accordance with FIG. 1, a housing wall.

The connection with the support 18 is provided via the rear fastening elements 34. The support 18 has screw receptacles arranged flush with the threaded receivers 36 of the fastening elements 34. The module carriers 20 can be fixed in place on the rear of the support 18 by fastening screws, which are passed through the screw receptacles and screwed into the threaded receivers 36. The screw receivers are applied on the support 18 in the graduation grid corresponding to the graduation grid of the threaded receivers 36 so that the module carriers 20 can be lined up at their mechanical interfaces.

As FIG. 1 shows, the lined-up module carriers 20 can be connected with additional anchoring elements in the area of or near the front connecting elements 35. For example, the module carriers 20 can be connected with each other at the lower fastening elements 35 by a transverse support in the broad direction of the component support. In this case, the transverse support can be constituted by the front wall 12 of the receiver housing 10. The front wall 12 has screw receptacles 13 for this purpose, into which the fastening screws can be inserted and screwed into the flush threaded receptacles 36.

An air guide element 14 is fastened by screw receivers 15 on the upper fastening elements 35.

German Patent Reference 10 2005 026 181.7, the priority document corresponding to this invention, and its teachings are incorporated, by reference, into this specification.

What is claimed is:

1. A component support comprising:
    at least two module carriers (20) aligned with each other in a direction across a width of the component support;
    each of the at least two module carriers having two opposing insert card guidance devices (30) connected with each other via a support element (21);

each of the insert card guidance devices (30) including a guide (31) for a portion of an insert card extending between a rear fastening element (34) and a front fastening element (35), the rear fastening element (34) including a rear threaded receiver and the front fastening element (35) including a front threaded receiver;

wherein each of the module carriers (20) is releasably connected with a rear support (18) by a fastening screw passed through a screw receptacle in the rear support and screwed into the rear threaded receiver so that a removal of a single arbitrary module carrier from a row of the module carriers (20) is possible; and a transverse connecting element extending in the width direction of the component support and attached to the at least two module carriers (20) by fastening screws passed through screw receptacles in the transverse connecting element and screwed into corresponding front threaded receivers of the at least two module carriers (20);

wherein an insert card inserted into each of the at least two module carriers is electrically connected by plug-in connections to the rear support (18).

2. The component support in accordance with claim 1, wherein the rear support (18) has rows of fastening receivers matched to each other in a grid-like manner, and a graduation of a grid pattern measurement is matched to a second graduation of fastening receivers of the aligned module carriers (20).

3. The component support in accordance with claim 1, wherein the rear support (18) is formed as a wall.

4. The component support in accordance with claim 1 further comprising a further guide rail (31.1) supported on the support element (21) between the two opposing insert card guidance devices (30).

5. The component support in accordance with claim 1, wherein the transverse connecting element holds the front fastening elements (35) of the at least two module carriers (20) flush.

6. The component support in accordance with claim 1, further comprising a second transverse connecting element, wherein the second transverse connecting element is attached to aligned front fastening elements (35) at ends of the at least two mobile carriers opposite the transverse connecting element.

7. The component support in accordance with claim 1, wherein the support element (21) is connected to the two opposing guidance devices (30) by a plurality of fastening screws.

8. The component support in accordance with claim 1, wherein each of the insert card guidance devices (30) of at least one of the at least two module carriers includes two guides (31).

9. The component support in accordance with claim 8, wherein the two guides (31) are connected by a plurality of strips (32) extending transversely with respect to the longitudinal direction of the guides (31), and openings are formed between the guides (31) by the strips.

10. The component support in accordance with claim 8, further comprising a further guide rail (31.1) supported on the support element (21) between the two opposing insert card guidance devices (30).

11. The component support in accordance with claim 10, further comprising spacers formed on the further guide rail (31.1) and disposed between the further guide rail (31.1) and the support element (21) to form ventilation openings between the further guide rail (31.1) and the support element (21).

* * * * *